Sept. 2, 1969 J. D. SUTTON 3,465,175
OVERLOAD PROTECTED TRANSISTOR AMPLIFIER
Filed Jan. 21, 1966
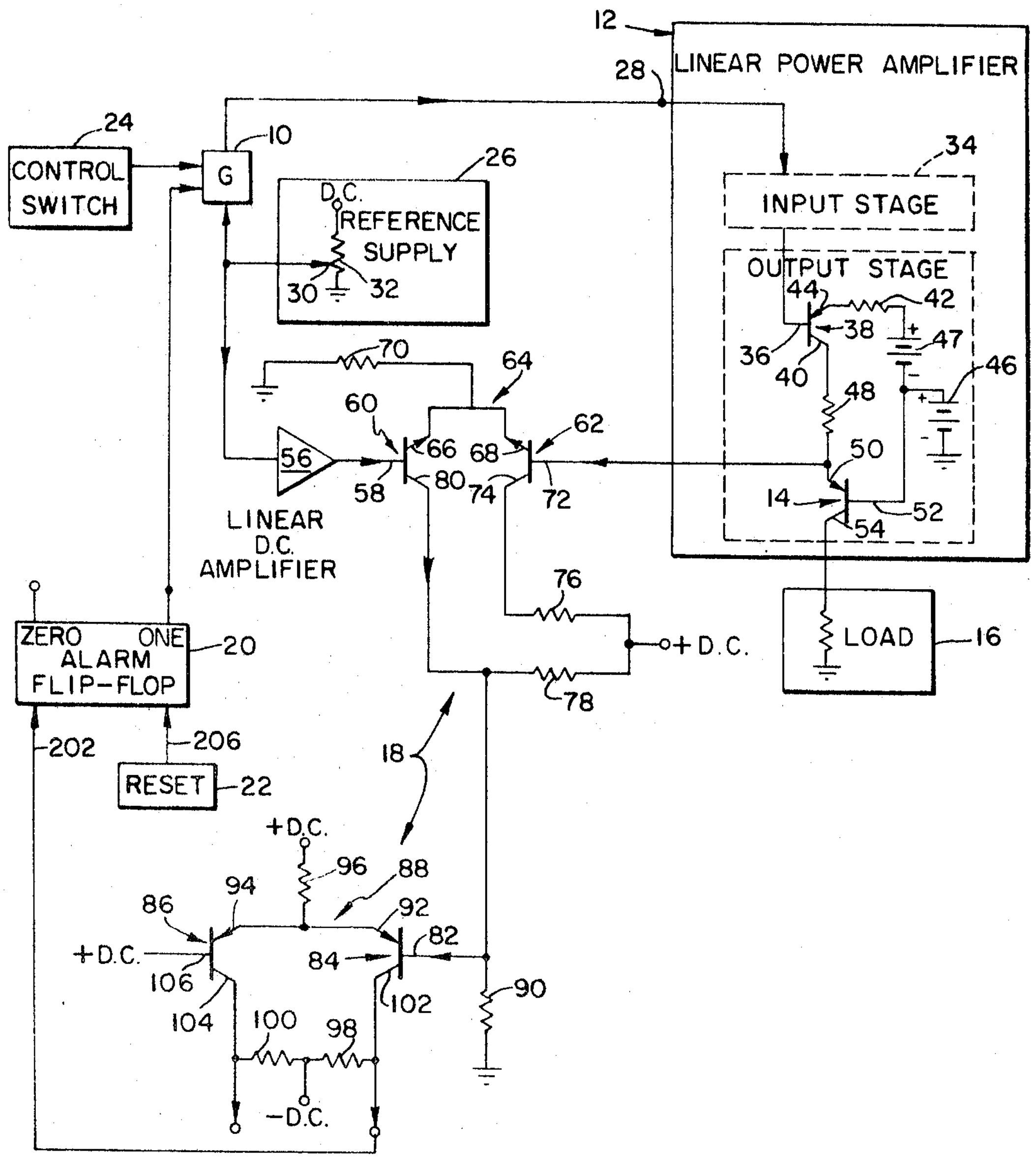
INVENTOR
JONEL D. SUTTON
BY
Blair, Buckles & Cesari
ATTORNEYS United States Patent Office 3,465,175

Patented Sept. 2, 1969

3,465,175

OVERLOAD PROTECTED TRANSISTOR AMPLIFIER

Jonel D. Sutton, Harvard, Mass., assignor to Digital Equipment Corporation, Maynard, Mass.

Filed Jan. 21, 1966, Ser. No. 522,280

Int. Cl. H03k *1/12*

U.S. Cl. 307—297 11 Claims

ABSTRACT OF THE DISCLOSURE

A temperature monitoring circuit compares the emitter-base voltage of a transistor delivering current to a load with a reference voltage related to the current input to the transistor. When the emitter-base voltage goes beyond the reference voltage, the monitoring circuit produces an alarm signal for turning off the transistor.

This invention relates to the protection of semiconductor devices from damage due to excessive power dissipation. More particularly, the invention provides an electrical circuit that monitors the temperature of a transistor junction and reduces the power delivered to the transistor when this temperature reaches an excessive level. The circuit monitors the temperature indirectly by responding to the voltage across the junction. This provides a much faster response than direct sensing of the temperature, which suffers from the thermal lag between the junction and a temperature-sensing transducer disposed a small but appreciable distance from the junction.

When an electrical supply is subjected to operation with unexpectedly low-resistance loads, destructive damage to the supply often results. Thus, in a semiconductor power supply having a series-connected output transistor, the transistor may dissipate so much power from the excessive load current that it burns out. Other components of the supply may also be damaged. It has heretofore been relatively costly to construct a power supply intended for high-resistance loads and, at the same time, capable of withstanding current surges into abnormally low-resistance loads.

Moreover, prior circuits for guarding against excessive current often do not develop an output signal in time to prevent transistor burnout. Thus, in one prior arrangement of this type, a thermistor is mounted in close proximity to a junction of the transistor whose operation is being monitored. The thermistor, however, does not sense an increase in dissipation in the transistor until a concomitant increase in the junction temperature (a) has propagated to the exterior of the transistor where the thermistor is located and then (b) has caused a corresponding increase in the temperature of the thermistor. The time required for the thermistor to respond to the abnormality may thus be unduly lengthened by a significant thermal lag in the temperature-sensing arrangement.

Accordingly it is an object of the present invention to provide improved electrical apparatus for protecting a semiconductor valving device from damage due to excessive power dissipation therein. It is a further object of the invention to provide such apparatus characterized by a rapid response to a change in the power dissipation in the valving device.

Another object of the invention is to provide a circuit for sensing excessive operation of a semiconductor valving device with sufficient speed to interrupt operation before the device is damaged.

Another object of the invention is to provide a transistor current driver having high speed and relatively low cost protection against burnout damage due to an abnormally low resistance load. As used herein, the term "current driver" means an electrical supply for impressing a substantial and controllable current in a load of moderate resistance with a fairly rapid rise time.

Other objects of the invention will in part be obvious and will in part appear hereinafter.

The invention accordingly comprises the features of construction, combination of elements, and arrangement of parts which will be exemplified in the construction hereinafter set forth, and the scope of the invention will be indicated in the claims.

For a fuller understanding of the nature and objects of the invention, reference should be had to the following detailed description taken in connection with the accompanying drawing, which is a schematic diagram of a current driver embodying the invention.

Considered briefly, the present temperature-monitoring circuit compares the emitter-base voltage of a transistor delivering current to a load with a reference voltage related to the current input to the transistor. When the emitter-base voltage drops below the reference voltage, the monitoring circuit produces an alarm signal for turning the transistor off.

The circuit operates on the fact that for a given emitter current, the emitter-base junction resistance of a transistor decreases when the junction temperature increases. The junction temperature, in turn, directly reflects the electrical power being dissipated in the transistor. Thus, the monitoring circuit produces an alarm whenever the transistor begins to dissipate excessive power.

More particularly, referring to the drawing, a current driver embodying the invention has a gate 10 that operates a linear power amplifier 12 to deliver current pulses through an output transistor 14 to a load 16. When the impedance of the load changes by such an amount that the dissipation in the transistor 14 exceeds a selected value, a sensing circuit indicated generally at 18 produces an alarm signal that switches an alarm flip-flop 20 to the ZERO state. In this state, the flip-flop disables the gate 10, thereby terminating the pulses from the amplifier 12.

A reset unit 22 is operable to switch the alarm flip-flop to the ONE state, where it enables the gate 10, thereby resuming operation of the current driver.

When the gate 10 is enabled, in response to the signal from a control switch 24 it applies a reference voltage from a reference supply 26 to the input terminal 28 of the power amplifier 12. The reference voltage can be adjusted by moving the tap 30 on a voltage divider 32 in the reference supply.

The power amplifier 12 has an input stage 34 that amplifies the reference voltage and applies a corresponding voltage to the base 36 of a transistor 38 in the output stage. The transistor 38 responds to the voltage at its base by passing a collector current proportional to the reference voltage from the supply 26. It draws its collector current through a resistor 42 and its emitter 44 from a supply shown as a battery 47 in series with a battery 46 whose negative terminal is grounded.

A resistor 48 passes the current from the collector 40 of transistor 38 to the emitter 50 of the output transistor 14. The transistor 14 has its base 52 connected to the positive terminal of the supply battery 46 and its collector 54 is connected with the load 16. It applies the current from the transistor 38 to the load 16 and with its common base connection, it operates as an impedance transformer, providing a relatively high output impedance. As a result, except when the transistor 14 saturates, the load 16 receives a current whose magnitude is substantially proportional to the reference voltage applied to the amplifier terminal 28.

As also shown in the drawing, the reference voltage from the supply 26 is applied to a linear direct current amplifier 56 whose output voltage is applied between ground and the base 58 of a transistor 60. In response to the reference voltage from the supply 26, the amplifier 56 produces an output voltage that corresponds to the emitter current produced in the transistor 14 in response to the same reference voltage. The amplifier output voltage also includes an offset corresponding to the voltage of the battery 46; for this purpose, the amplifier 56 can be connected to receive the voltage from the battery. The transistor 60 is arranged with a transistor 62 in a differential amplifier indicated generally at 64. A resistor 70 is connected between the emitters 66 and 68, respectively, of the transistors 60 and 62 and ground. The base 72 of the transistor 62 is connected to the emitter of the power amplifier transistor 14 to receive, with respect to ground, the emitter-base voltage of the transistor 14 superimposed on the constant voltage of the supply battery 46.

A resistor 76 is connected between the collector 74 of the transistor 62 and a source of positive voltage, and a resistor 78 connects the collector 80 of transistor 60 to the same source.

The collector 80 is also connected to the base 82 of a transistor 84 arranged with a transistor 86 in a second differential amplifier indicated at 88. A resistor 90 is between the base 82 and ground. The emitters 92 and 94 of the transistors 84 and 86, respectively, are connected to a supply of positive direct voltage through a common resistor 96, and resistors 98 and 100 connect the transistor collectors 102 and 104, respectively, to a supply of negative direct voltage. The base 106 of the transistor 86 is connected to a positive direct voltage. The collector 102 of the transistor 84 is connected also to the ZERO input terminal 202 of the alarm flip-flop 20.

During operation of the current driver, transistor 14 dissipates an amount of power substantially equal to the product of its emitter-collector voltage drop and the emitter current. This power is dissipated in the form of heat released in the junction structure of the transistor. The emitter current of the transistor is essentially constant and independent of the load, being fixed by the reference voltage applied to the power amplifier input terminal 28.

The emitter-collector voltage, however, varies with the resistance of the load 16. In particular, the emitter-collector voltage plus the voltage across the load is essentially constant, being equal to the voltage of the supply battery 46 plus the relatively small emitter-base voltage drop. Hence, when the resistance of the load is large, the substantially constant current therein develops a large voltage drop; the emitter collector voltage in the transistor 14 is correspondingly small. The transistor then dissipates relatively little power.

Thus, with a high-resistance load, the transistor 14 is relatively cool and its emitter-base resistance is relatively large. This, in turn, causes the transistor to have a relatively large emitter-base voltage drop for the known emitter current. The relatively large emitter-base voltage drop plus the voltage of the battery 46 appear between the differential amplifier base 72 and ground; they maintain the base 72 positive with respect to the voltage the amplifier 56 applies to the base 58 of transistor 60. Accordingly, the transistor 62 conducts more than the transistor 60.

In the second differential amplifier 88, the voltage at the base 82 of transistor 84 is then positive with respect to the voltage at the base 106 of transistor 86. With the high gain provided by the amplifiers 64 and 88, transistor 86 saturates and the transistor 84 is turned off. The collector 102 is thus at the negative supply voltage, leaving the alarm flip-flop 20 unaffected.

When the resistance of the load 16 decreases, the voltage drop across it decreases proportionately. This causes a corresponding increase in the collector-base voltage of transistor 14 and hence the dissipation in the transistor increases. The resultant heat produced in the transistor decreases its emitter-base resistance. Accordingly, the transistor emitter-base voltage drop decreases, and the voltage at the base 72 of the differential amplifier transistor 62 decreases by the same amount, with a resulting decrease in conduction in the transistor 62. When the power dissipation in the transistor 14 increases to the danger point, the corresponding decrease in the emitter-base voltage of the transistor is amplified sufficiently by the amplifiers 64 and 88 to saturate and turn off transistor 86.

When the transistor 84 commences conducting, its collector voltage increases to the point where it can switch the alarm flip-flop to the ZERO state, thereby disabling the gate 10. The gate in turn interrupts the reference voltage applied to the power amplifier input terminal 28, thereby shutting the amplifier off and terminating the current in the transistor 14.

The reset unit 22 can be constructed in any one of many conventional ways and connected to the ONE input terminal 206 of flip-flop 20 to switch the flip-flop again to the ONE condition, thereby resuming operation. If the cause of the high dissipation in the transistor 14 is still present when the equipment recommences operation, the circuit will essentially instantaneously produce another alarm signal and again turn the power amplifier off.

The differential amplifier 64 thus monitors the temperature of the transistor 14 emitter-base junction structure directly, i.e., without intervening transducers and the attendant thermal lags. As a result, the alarm signal from the differential amplifier 88 turns off the transistor 14 before it burns out.

More particularly, the response time of the monitoring circuit and associated cutoff gating means 20 and 10, is only 50 nanoseconds ($50\times10^{-9}$ seconds) in a typical circuit. The time constant between the onset of excessive dissipation in the transistor and destruction of the transistor is considerably longer, typically 5 milliseconds ($5\times10^{-3}$ seconds). Thus, the invention provides remarkably rapid and reliable monitoring of the dissipation in the junction structure and cessation of operation before it damages the transistor.

Moreover, when the reference supply 26 is adjusted to change the emitter current in the transistor 14, the output voltage of the amplifier 56 changes by a corresponding amount. The cutoff level of the emitter-base voltage in transistor 14 hence changes automatically when the transistor-emitter current is changed.

It should be noted that the amplifiers 12 and 56 are linear to facilitate relating the emitter current in transistor 14 to the voltage applied to the base 58 of the differential amplifier transistor 60. Moreover, the amplifier 56 can have an adjustable gain to change the value of the emitter-base voltage in transistor 14 at which the alarm signal is produced for any given output current.

The circuit described above is not limited to operation where the collector and emitter currents in the transistor 14 are essentially equal. That is, when the load 14 has a relatively high resistance so that the voltage across it places the transistor collector 54 at essentially the same voltage as the base 52, the transistor 14 becomes saturated and its voltage gain decreases. In this condition, a substantial portion of the known input emitter current passes to the base 52 rather than to the collector 54. Nevertheless, the differential amplifier 64 continues to compare the emitter-base voltage in the transistor 14 with the voltage from the amplifier 56 and to operate the output differential amplifier 88 in the same manner as described above when the transistor 14 is not saturating.

The invention is also applicable to sense when the environmental temperature of the transistor 14 becomes too high for the transistor's emitter current. The operation of the circuit for heat external to the transistor is the same as when sensing heat produced within the transistor.

In summary, the present invention provides a dissipation-monitoring circuit that compares the emitter-base resistance of a transistor or like semiconductor valving device with a reference value corresponding to the transistor-emitter current. The circuit produces an alarm signal when the emitter-base resistance drops below the reference value, a condition brought about by excessive transistor temperature.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described the invention, what is claimed as new and secured by Letters Patent is:

1. Electrical apparatus comprising in combination:

(A) a transistor having first and second p-n junctions arranged in series to conduct forward current between the emitter and collector terminals of the transistor when said first junction is forward biased, said first junction having a resistance which varies with changes in the temperature of said junctions, (B) means producing a reference voltage corresponding in amplitude to the current input to said emitter terminal, and (C) output means:

(1) comparing said reference voltage with the voltage across said first junction, and (2) producing an output signal when the value of said reference voltage goes beyond a predetermined value relative to said first junction voltage, thereby indicating excessive temperature of said transistor.

2. Electrical apparatus comprising in combination (A) an electrical amplifier:

(1) having a semiconductor valving device in which first and second p-n junctions are arranged in series to conduct forward current between emitter and collector terminals when said first junction is forward biased, said first junction having a resistance which varies with changes in the temperature of said junctions, (2) delivering to said emitter terminal a current corresponding to a first voltage, (B) first means for substantially diminishing the current delivered to said emitter terminal in response to an alarm signal, (C) second means:

(1) comparing a reference voltage corresponding in amplitude to said first voltage with a second voltage corresponding to the voltage across said first junction, and (2) producing said alarm signal when said reference voltage goes beyond a predetermined value relaitve to said second voltage thereby indicating excessive temperature of said transistor.

3. Apparatus according to claim 2 in which said amplifier and said first means are so constructed that the amplitude of said reference voltage is a linear function of the amplitude of said current delivered to said emitter terminal and the amplitude of said second voltage is a linear function of the amplitude of said first junction voltage.

4. Apparatus according to claim 2 in which said second means comprises a differential amplifier having first and second input terminals and receiving said reference voltage at said first input terminal thereof and receiving said second voltage at said second input terminal thereof.

5. An electrical supply comprising in combination:

(A) a linear amplifier including:

(1) first circuit means producing an essentially constant current having a known amplitude relative to an input voltage, (2) a transistor conducting said current between the emitter thereof and the collector thereof, said transistor having an emitter-base junction whose resistance changes with changes in the temperature of said transistor, and (B) a high gain differential amplifier:

(1) having first and second input terminals, (2) receiving at said first input terminal a first voltage corresponding to the voltage between the emitter and the base of said transistor, said voltage varying with changes in said junction resistance, (3) receiving at said second input terminal a second voltage corresponding to said input voltage, and (4) producing a first output signal when said first voltage is less than a known function of said second voltage and producing a different second signal when said first voltage is greater than said function of said second voltage so as to indicate excessive temperature of said transistor.

6. An electrical supply according to claim 5 further comprising resettable gate means in circuit with said linear amplifier and with said comparative amplifier and terminating said input voltage in response to said second output signal from said comparative amplifier.

7. An electrical supply comprising in combination:

(A) an adjustable supply of reference voltage, (B) a first amplifier:

(1) in circuit with said supply for receiving said reference voltage, (2) having a first stage producing an essentially constant current corresponding in amplitude with said reference voltage, and (3) having a transistor arranged in a common base circuit with its emitter connected to receive said current from said first stage, said transistor having an emitter-base junction whose resistance changes with changes in the temperature of said transistor, (C) a second amplifier:

(1) connected with said supply and receiving said reference voltage, and (2) developing an output voltage related in amplitude with said reference voltage, and (D) comparing means:

(1) having first input terminals connected with said second amplifier and receiving said output voltage therefrom, (2) having means forming second input terminals connected to receive the emitter-base voltage of said transistor, and (3) developing an output alarm signal when the difference between the voltage at said second terminals and the voltage at said first terminals goes beyond a predetermined value, thereby indicating an excessive temperature of said emitter-base junction.

8. An electrical supply according to claim 7 in which said comparing means comprises a differential amplifier.

9. An electrical supply according to claim 7 further comprising gate circuit means:

(A) connected between said adjustable supply and said first amplifier, (B) in circuit with said comparing means, and (C) interrupting the application of said reference voltage to said first amplifier when said alarm signal is present.

10. An electrical supply according to claim 9:

(A) in which said gate means applies said reference voltage to said first amplifier in response to the coincidence of a first input signal and the absence of said alarm signal, and (B) further comprising source means connected with said gate means for applying said first input signal thereto.

11. An electrical supply according to claim 9 further comprising:

(A) reset means, and (B) an electrical register (1) connected with said comparing means and with said reset means, (2) storing a first number when said alarm signal is present and storing a second number in response to a signal from said reset unit, and (3) enabling said gate means to apply said reference voltage to said first amplifier only when storing said second number.

References Cited

UNITED STATES PATENTS

| | | | |
|---|---|---|---|
| 3,058,034 | 10/1962 | Sandin | 317—33 |
| 3,100,863 | 8/1963 | McCullough | 317—33 |
| 3,303,387 | 2/1967 | Springer | 317—31 |
| 3,383,585 | 5/1968 | Gately | 317—33 |
| 3,396,292 | 8/1968 | Lansink | 307—297 |

JOHN S. HEYMAN, Primary Examiner

H. A. DIXON, Assistant Examiner

U.S. Cl. X.R.

307—310